(12) United States Patent
Leenders et al.

(10) Patent No.: US 9,632,425 B2
(45) Date of Patent: Apr. 25, 2017

(54) LITHOGRAPHIC APPARATUS, A DRYER AND A METHOD OF REMOVING LIQUID FROM A SURFACE

(75) Inventors: Martinus Hendrikus Antonius Leenders, Rhoon (NL); Sjoerd Nicolaas Lambertus Donders, Vught (NL); Harry Sewell, Ridgefield, CT (US); Louis John Markoya, Sandy Hook, CT (US); Marcus Martinus Petrus Adrianus Vermeulen, Leende (NL); Diane Czop McCafferty, Sandy Hook, CT (US)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 664 days.

(21) Appl. No.: 11/984,825

(22) Filed: Nov. 21, 2007

(65) Prior Publication Data

US 2008/0192214 A1 Aug. 14, 2008

Related U.S. Application Data

(60) Provisional application No. 60/999,769, filed on Dec. 7, 2006.

(51) Int. Cl.
*G03B 27/52* (2006.01)
*G03F 7/20* (2006.01)

(52) U.S. Cl.
CPC .............. *G03F 7/70341* (2013.01)

(58) Field of Classification Search
CPC .............. G03F 7/70916; G03F 7/70341

USPC ................................................ 355/30, 53
See application file for complete search history.

(56) References Cited

U.S. PATENT DOCUMENTS

| 3,573,975 | A | 4/1971 | Dhaka et al. ............... 117/212 |
| 3,648,587 | A | 3/1972 | Stevens ......................... 95/44 |
| 4,346,164 | A | 8/1982 | Tabarelli et al. ........... 430/311 |
| 4,390,273 | A | 6/1983 | Loebach et al. ............ 355/125 |
| 4,396,705 | A | 8/1983 | Akeyama et al. ........... 430/326 |
| 4,405,701 | A | 9/1983 | Banks et al. .................. 430/5 |

(Continued)

FOREIGN PATENT DOCUMENTS

| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Chia-How Michael Liu
(74) *Attorney, Agent, or Firm* — Pillsbury Winthrop Shaw Pittman LLP

(57) ABSTRACT

A new way of drying and/or wetting a surface, such as a top surface of a substrate, which is useful in immersion lithography. The surface is placed under a single phase extractor and a priming liquid is delivered between the single phase extractor and the surface. The single phase extractor is only activated after the priming liquid has been provided between the single phase extractor and the surface. Priming liquid is delivered to the single phase extractor during the whole of the drying and/or wetting process.

37 Claims, 7 Drawing Sheets

(56) References Cited

U.S. PATENT DOCUMENTS

| | | | |
|---|---|---|---|
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 6,952,253 B2* | 10/2005 | Lof et al. | 355/30 |
| 6,954,993 B1* | 10/2005 | Smith et al. | 34/407 |
| 7,119,874 B2 | 10/2006 | Cox et al. | |
| 7,196,770 B2 | 3/2007 | Baselmans et al. | |
| 7,317,507 B2* | 1/2008 | Straaijer | 355/53 |
| 7,367,345 B1 | 5/2008 | Hemker et al. | |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Maria Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0221234 A1* | 10/2005 | Ito | 430/322 |
| 2005/0233081 A1 | 10/2005 | Tokita | 427/256 |
| 2005/0259232 A1 | 11/2005 | Streefkerk et al. | 355/53 |
| 2006/0007419 A1* | 1/2006 | Streefkerk et al. | 355/53 |
| 2006/0038968 A1 | 2/2006 | Kemper et al. | 355/18 |
| 2006/0103816 A1 | 5/2006 | Belfroid et al. | 355/30 |
| 2006/0119813 A1 | 6/2006 | Hultermans et al. | 355/53 |
| 2006/0121209 A1 | 6/2006 | Matheus Baselmans et al. | |
| 2006/0257553 A1 | 11/2006 | Ohta et al. | |
| 2007/0030464 A1 | 2/2007 | Kemper et al. | 355/30 |
| 2007/0216889 A1* | 9/2007 | Nishii | 355/67 |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| EP | 1 420 300 A3 | 8/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-289126 | 10/2004 |
| JP | 2005-045223 | 2/2005 |
| JP | 2006-165570 | 6/2006 |
| JP | 2006-310827 | 11/2006 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/102646 A1 | 11/2004 |
| WO | WO 2004/105107 A1 | 12/2004 |
| WO | 2005/003864 A2 | 1/2005 |
| WO | WO 2005/010611 | 2/2005 |
| WO | WO 2005/022616 A1 | 3/2005 |
| WO | WO 2005/024517 | 3/2005 |
| WO | 2005/036621 | 4/2005 |
| WO | WO 2005/036623 A1 | 4/2005 |
| WO | WO 2005/064405 A2 | 7/2005 |
| WO | WO 2005/064405 A3 | 7/2005 |
| WO | 2006/101120 | 9/2006 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and tissues", SPIE Microlithography 2003, 5040-186, Feb. 27, 2003.

(56) References Cited

OTHER PUBLICATIONS

S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).
Japanese Office Action mailed Nov. 18, 2010 in corresponding Japanese patent application No. 2007-316642.
Japanese Office Action mailed Apr. 12, 2013 in corresponding Japanese Patent Application No. 2011-124883.

\* cited by examiner

Fig. 2
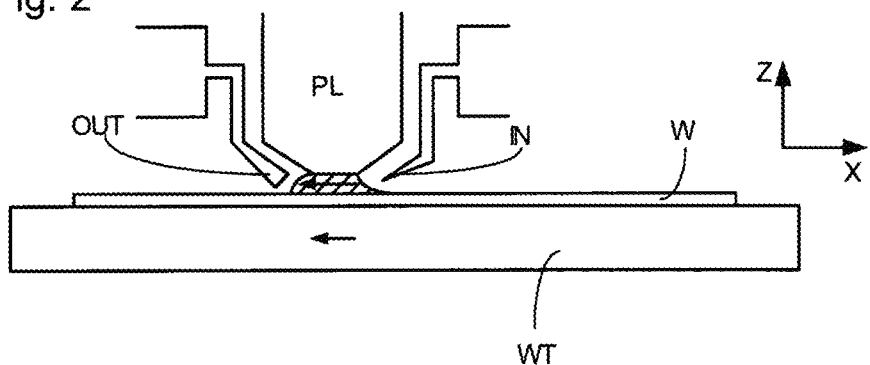
Fig. 3
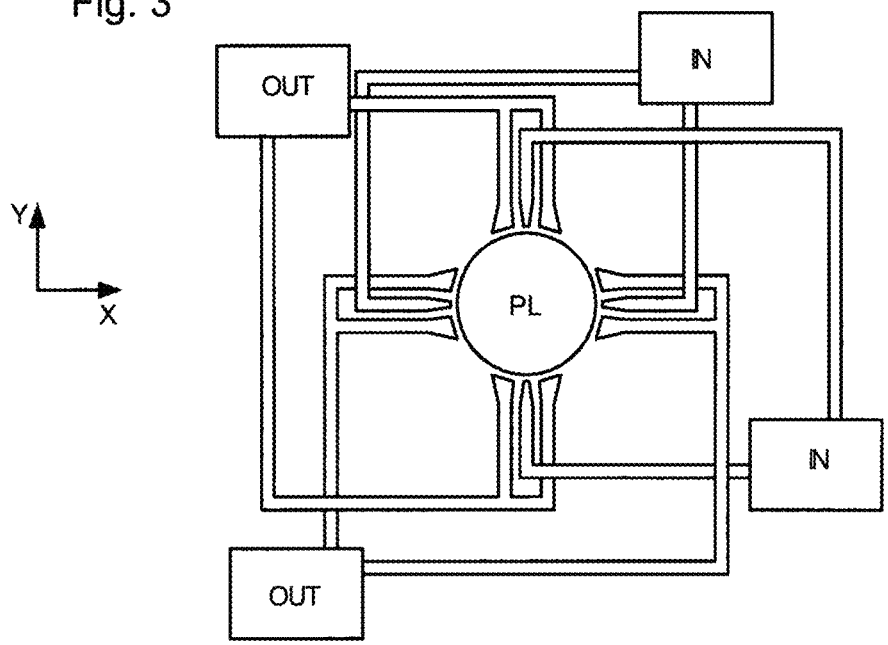
Fig. 4
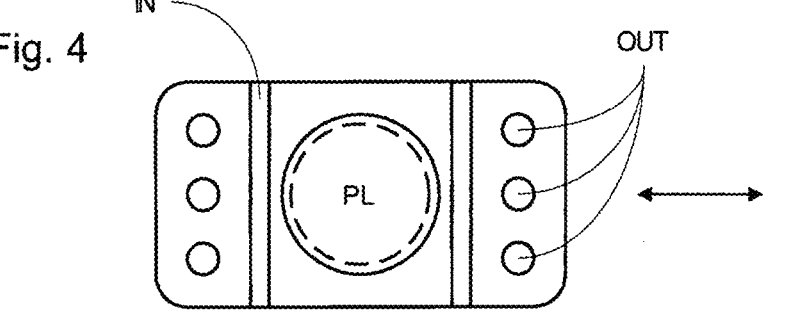
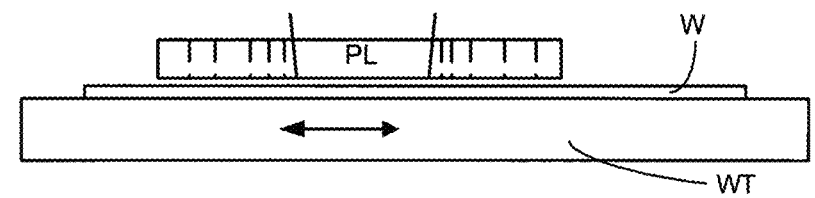

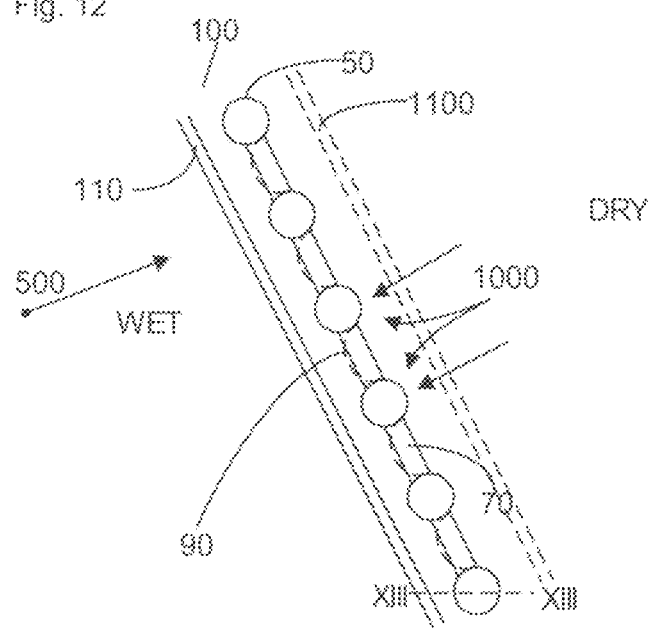
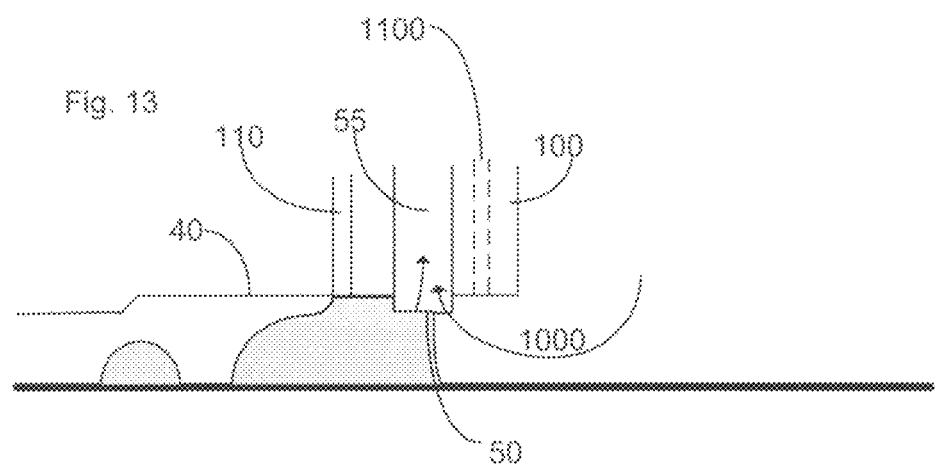

LITHOGRAPHIC APPARATUS, A DRYER AND A METHOD OF REMOVING LIQUID FROM A SURFACE

This application claims priority to and benefit from U.S. Provisional Patent Application No. 60/999,769, filed Dec. 7, 2006, the entire contents of which is hereby incorporated by reference.

FIELD

The present invention relates to a lithographic apparatus, a dryer and a method for removing water from a surface.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another way of performing immersion lithography is disclosed in, for example, PCT patent application publication WO 2005/064405. In this method the whole of the top surface of the substrate W is allowed to be covered in immersion liquid. The level of immersion liquid under the projection system is kept higher than elsewhere by a liquid constraining unit, but no particular effort is made to confine liquid just to the localized area of the substrate under the projection system. Thus, it becomes desirable to dry the substrate W (and the top surface of the substrate table or any sensors which may have been covered in immersion liquid) prior to removing the substrate from the substrate table for further processing.

SUMMARY

It is desirable, for example, to provide an apparatus with good liquid removal performance.

According to an aspect of the invention, there is provided a lithographic projection apparatus comprising:
  a substrate table configured to hold a substrate;
  a projection system configured to project a patterned beam of radiation onto the substrate; and
  a liquid remover configured to remove existing liquid from a top surface of an object and a liquid delivery device configured to prime the liquid remover by delivering a priming liquid to the liquid remover.

According to an aspect of the invention, there is provided a dryer configured to dry a surface, the dryer comprising:
  an outlet connected to an under pressure source and covered by a porous material to allow single phase extraction of liquid from the surface; and
  a liquid supply system configured to continually provide liquid to a space between the outlet and the surface to maintain liquid contact between the porous material and the surface.

According to an aspect of the invention, there is provided a wetting unit configured to wet a surface, the wetting unit comprising:
  an outlet connected to an under pressure source and covered by a porous material to allow single phase extraction of liquid from the surface;
  a liquid supply system configured to continually provide liquid to a space between the outlet and the surface to maintain liquid contact between the porous material and the surface.

According to an aspect of the invention, there is provided a dryer configured to dry a surface, the dryer comprising:
  a plurality of outlets arranged in a line and each connected to an under pressure source; and a liquid supply system configured to continually provide a priming liquid to the surface on a side of the line of outlets.

According to an aspect of the invention, there is provided a method of removing liquid from a surface, the method comprising: positioning the surface under a liquid remover; delivering a priming liquid to the liquid remover; and activating the liquid remover to start removing the liquid.

According to an aspect of the invention, there is provided a device manufacturing method comprising using lithography and removing liquid from a surface, the liquid removing comprising positioning the surface under a liquid remover, delivering a priming liquid to the liquid remover, and activating the liquid remover to start removing the liquid.

According to an aspect of the invention, there is provided a dryer configured to dry a surface, the dryer comprising: an outlet connected to an under pressure source; and an inlet configured to create a flow of gas over, and substantially parallel to, the surface.

According to an aspect of the invention, there is provided a dryer configured to dry a surface, the dryer comprising: a sensor configured to detect a distance between the dryer and a surface being dried; and an actuator configured to control the distance between the dryer and the surface being dried based on a signal representative of the distance received from the sensor.

According to an aspect of the invention, there is provided a dryer configured to dry a surface, the dryer comprising: a first gas knife configured to extract liquid from the surface; a second gas knife spaced from the first gas knife and configured to extract liquid from the surface; and a disrupter positioned between the first gas knife and the second gas knife, the disruptor being configured to initiate break-up of a film of liquid on the surface into droplets.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 12 illustrates, in plan, a further embodiment of the invention;

FIG. 13 illustrates, in cross-section, the embodiment of the invention of FIG. 12;

DETAILED DESCRIPTION

Figure 1:
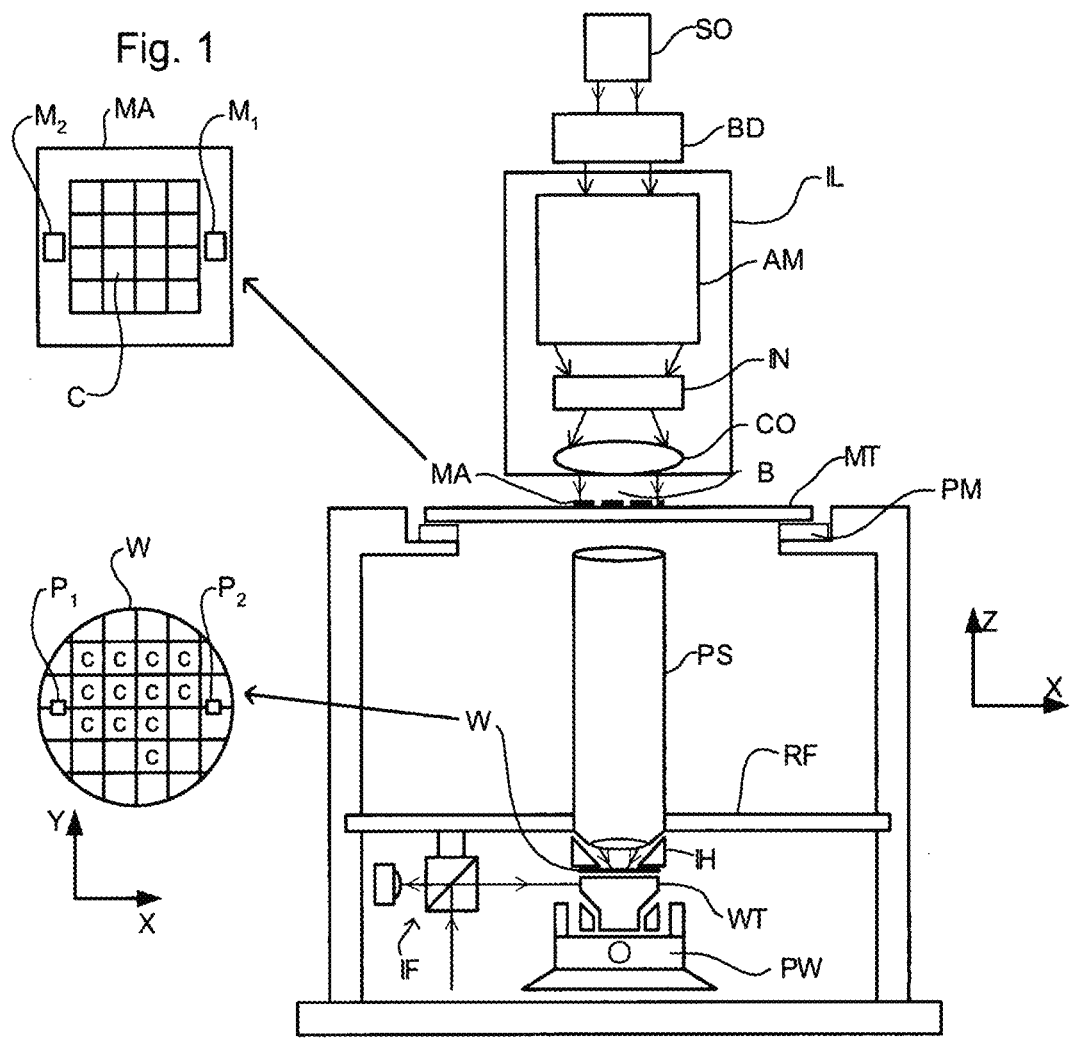
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
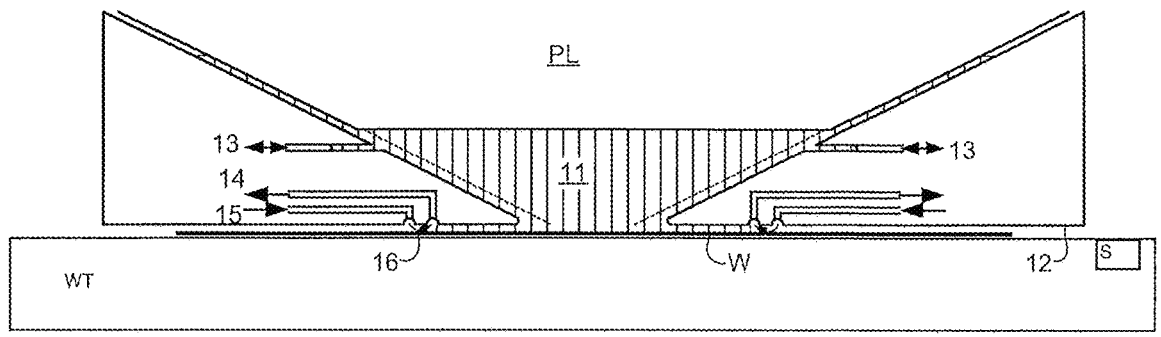
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

As discussed above, FIGS. 2-5 illustrate so called localized area liquid supply systems in which liquid is supplied between a final element of the projection system PS and the substrate W on only a localized area of the substrate W which is (typically much) smaller, in plan, than the total top surface of the substrate W. The substrate W is then moved under the projection system PS so that the localized area, which is covered in immersion liquid, changes.

These localized area liquid supply systems provide means for containing the liquid. Desirably a contactless means for containing the liquid is provided such that there is no physical contact between physical parts of the liquid supply system and the substrate W. This may be provided, for example, by surface tension of the liquid. This may also or alternatively be provided, for example, by a flow of gas and such a system is illustrated in FIG. 5 in which a flow of gas 16 from an inlet 15 to an outlet 14 in a bottom surface of liquid confinement structure 12 of a liquid supply system is effective to create a seal between the bottom of the liquid confinement structure 12 and the substrate W.

A problem with the localized area liquid supply systems of FIGS. 2-5 is that there is a finite speed at which the substrate can move relative to the liquid supply system before a seal between the liquid supply system and the substrate breaks down. One way of dealing with this difficulty is simply to do away with any attempt to seal between the liquid supply system and the substrate and to allow the liquid to flow out of the liquid supply system onto the remaining surface of the substrate (not under the projection system) and possibly even out onto the substrate table and any sensors S on the substrate table. The liquid can then be removed from the top surface of the substrate table. This approach differs from the bath type approach (in which the substrate is immersed in a bath of liquid) in that the thickness of the liquid which covers the substrate is maintained as low as possible, primarily to avoid the formation of waves on the top surface of the liquid which can disturb the substrate. The level of liquid is only maintained high between the projection system and the substrate by the use of a liquid confinement structure 12 similar to that illustrated in FIG. 5 but without the inlets and outlets 15, 14.

In the above mentioned arrangement, the substrate may be pre-wetted prior to the start of imaging and it is clearly desirable to move any remaining liquid (be it in the form of a film or discrete droplets) from the surface of the substrate prior to removing the substrate from the substrate table.

Figure 6:
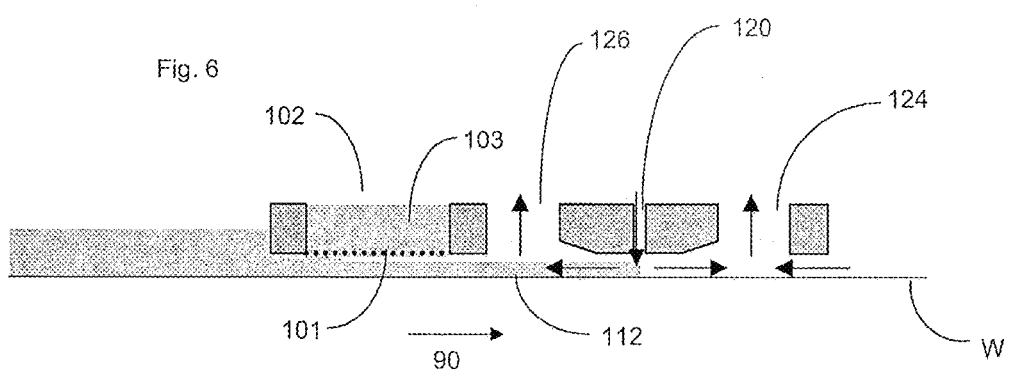
FIGS. 6 and 7 illustrate, in cross-section, a drying unit.

FIG. 6 illustrates a dryer which may be used to dry the top surface of the substrate W or substrate table WT. The dryer comprises a single phase extractor 102 which extracts only liquid from the surface of the substrate W. The dryer also comprises a gas knife 120 and two outlets 124, 126 connected to an under pressure either side of the gas knife 120. As can be seen, the substrate W moves in the direction of arrow 90 so that the single phase extractor 102 extracts liquid from the top surface of the substrate W and any liquid 112 which makes it past the single phase extractor 102 is then removed by the gas knife 120 so that a combination of gas and liquid is removed out of outlet 126. Generally only gas will be extracted out of outlet 124 on the other side of the gas knife to the single phase extractor 102.

The single phase extractor 102 comprises a chamber 103 which is maintained at a slight under pressure and is filled with liquid. The lower surface of the chamber is formed of a thin plate 101 having a large number of small holes, e.g., of a diameter in the range of 5-50 μm i.e. by a porous membrane/plate. In an embodiment, the plate 101 is at least slightly hydrophilic i.e. having a contact angle of less than 90° or lower, for example less than 50° or less than 30° to the liquid. The under pressure is such that a meniscus is formed in the holes in the perforated plate 101 and this helps to prevent gas being drawn into the chamber of the single phase extractor 102. However, when the plate comes into contact with liquid on the surface of the substrate W there is no meniscus to restrict flow and the liquid can flow freely into the chamber of the single phase extractor 102. Such a device can remove most of the liquid from the surface of the substrate W, though a thin film of liquid 112 may remain, as shown in FIG. 6. United States patent publication US 2006-0038968 describes such a single phase extractor in detail and is incorporated herein its entirety by reference.

The gas knife 120 and outlets 126, 124 then remove the thin remaining film 112 of liquid.

The film of liquid left behind on the substrate in the above mentioned immersion lithography technique, wherein liquid is allowed to cover the whole surface of the substrate, may be 1-2 mm thick. However, in order to reduce the generation of waves in that layer of liquid, it is desired to reduce the film thickness to less than 0.6 mm, desirably less than 0.1 mm. In such a circumstance the use of a dryer such as that illustrated in FIG. 6 may become problematic. For example, the original film of liquid on the substrate may not be thick enough to touch the perforated plate 101 of the single phase extractor 102 so that the gas knife 120 must remove the whole thickness of the film. Under such a circumstance, the gas knife may fail.

It is not necessarily easy to simply lower the level of the dryer 100 of FIG. 6 in order that a thin film of liquid touches the plate 101 because of the need to avoid contact of the dryer 100 with the top surface of the substrate W to avoid damage.

Figure 7:
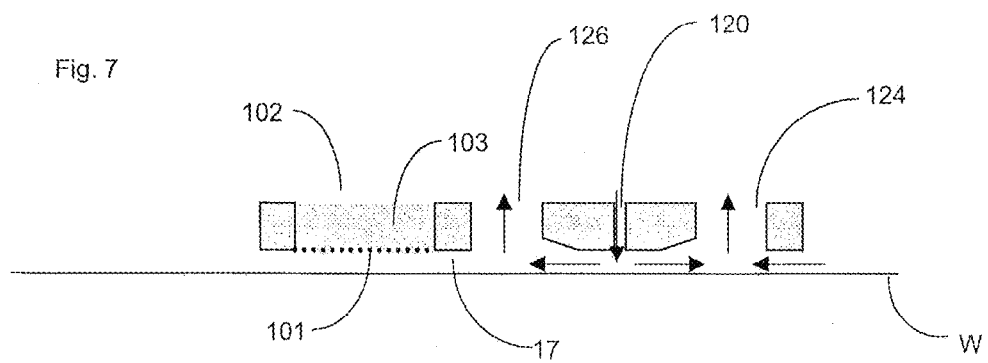

A further difficulty with the dryer of FIG. 6 is illustrated in FIG. 7. At the very end of the drying action, the last standing liquid 17 between the porous member 101 of the single phase extractor 102 and the outlet 126 can remain. When the liquid 17 evaporates, a drying stain is likely to result.

An embodiment of the present invention will be described first as an improvement on the dryer of FIGS. 6 and 7. However, the same principles are equally applicable to any other type of dryer using a different liquid remover other than a single phase extractor. Such an example is described with respect to FIGS. 12 and 13.

Figure 8:
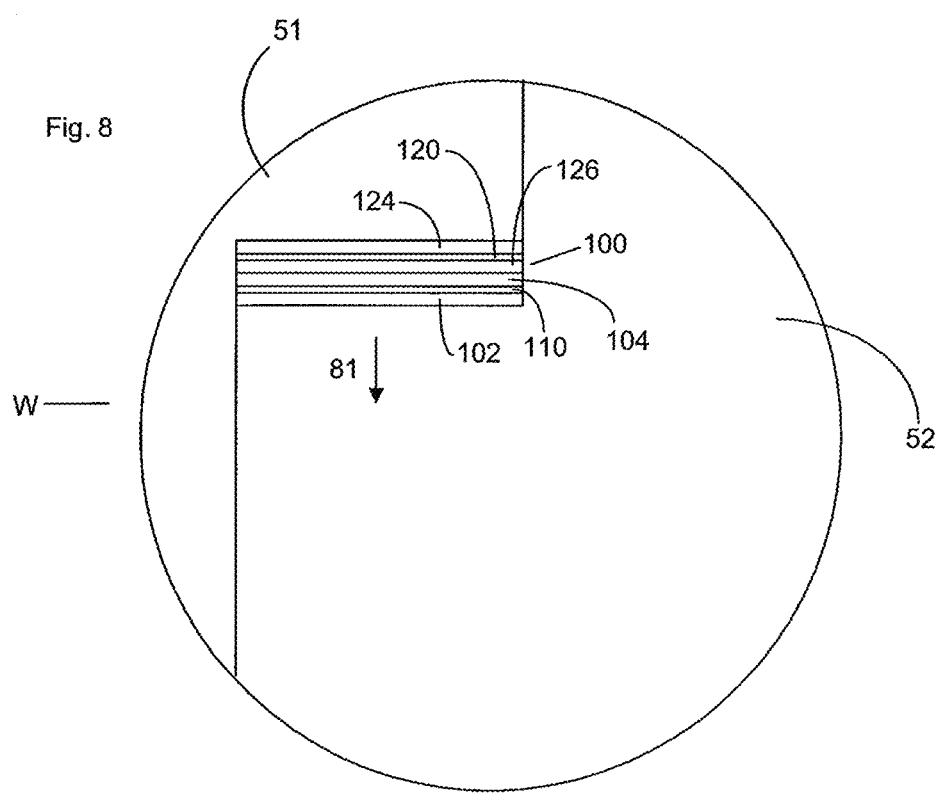
FIG. 8 depicts, in plan, a substrate during drying by a drying unit according to an embodiment of the present invention.

FIG. 8 illustrates, in plan, a dryer 100 of an embodiment of the present invention during drying of a substrate W. The area 51 of the top surface of the substrate W has been dried and the remainder of the top surface 52 of the substrate W is being dried by relative movement of the dryer 100 in direction 81 across the top surface of the substrate W (i.e., caused by movement of the substrate W under the dryer 100, movement of the dryer 100 over the substrate W, or both). The dryer can dry a film of liquid as well as discrete droplets. Actually, it is more likely that the dryer is longer (at least as long as the width of the substrate or even the whole substrate table WT) so that the substrate (and substrate table) can be dried in one pass. The dryer 100 comprises the same components as the dryer of FIGS. 6 and 7 as well as a liquid supply system 110 and a second single phase extractor 104. The single phase extractors 102, 104 can either be regarded as two separate single phase extractors or as one single phase extractor with a liquid supply system 110 positioned therein.

Figure 9:
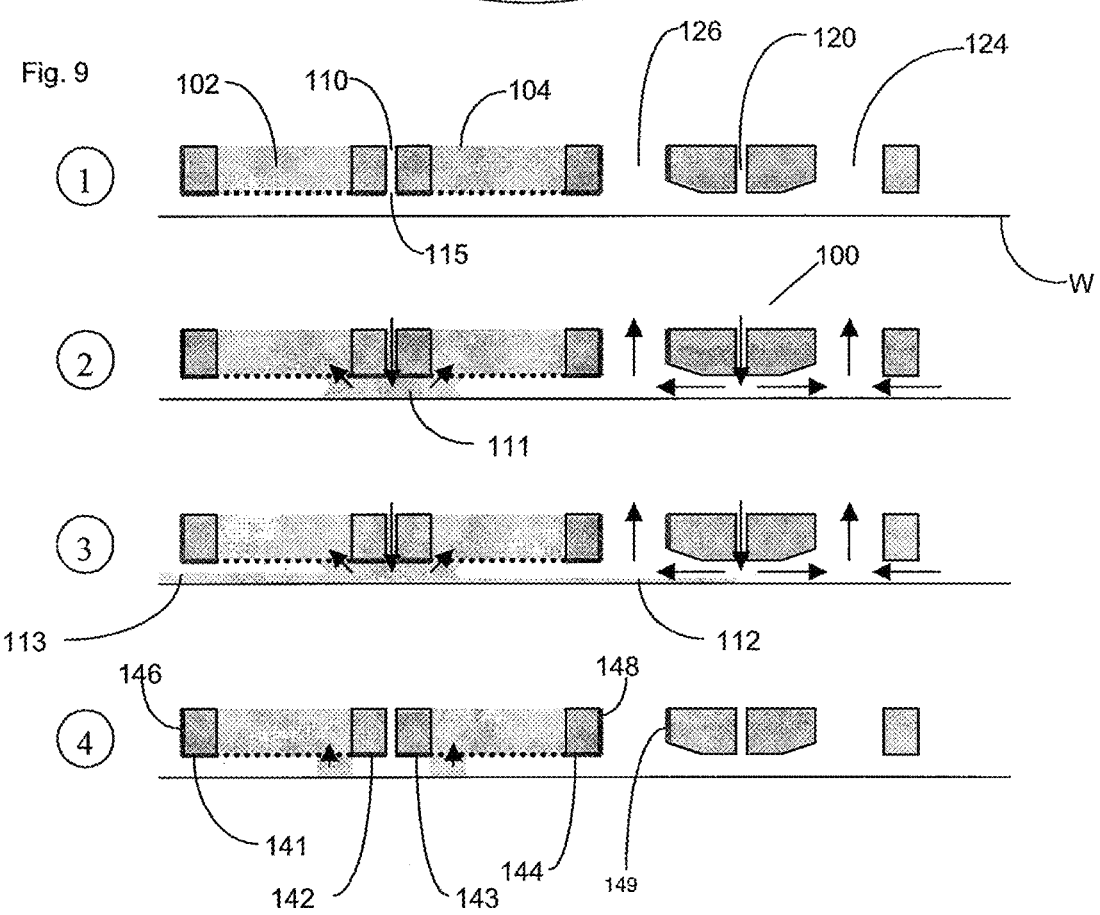
FIG. 9 illustrates the steps carried out during drying and using a drying unit according to an embodiment the present invention, which drying unit is shown in cross-section.

FIG. 9 illustrates the dryer 100 of FIG. 8 in cross-section (in the direction of relative movement of the dryer 100 across the substrate W) and illustrates the steps which are taken during a drying action.

As can be seen, an inlet 115 of the liquid supply system 110 is provided between the first single phase extractor 102 and the outlet 126. Desirably, a second single phase extractor 104 is provided on the other side of the liquid inlet 115. Other arrangements are also possible so long as the inlet 115 is positioned such that, in use, liquid can be forced out of the inlet 115 onto the substrate W such that the gap between the single phase extractor 102, 104 and the substrate W is filled with liquid. The precise position of the inlet 115 is not important and it may be on the other side of the single phase extractor 102 when there is only one single phase extractor, for example.

The function of the inlet 115 and the liquid supply system 110 is to provide a liquid to prime the single phase extractor 102, 104 by delivering a priming liquid 111 between the single phase extractor 102, 104 and the substrate W.

As can be seen from FIG. 9, in the second part, the liquid supply system 110 has provided priming liquid 111 to fill the gap between the substrate W and both of the single phase extractors 102, 104. The dryer 100 is now ready to begin drying and the substrate W can be moved under the dryer 100. The liquid supply system 110 keeps providing priming liquid 111 during the whole drying process to ensure that the gap between the substrate W and the single phase extractor 102, 104 is always filled with liquid.

As is shown in the third part of FIG. 9, this arrangement allows the single phase extractors 102, 104 to extract liquid 113 from the surface of the substrate W which has a thickness which is not thick enough to span the gap between the substrate W and the single phase extractor 102, 104 on its own. Thus, the use of the priming liquid 111 helps ensure that the gap between the substrate W and the bottom surface of the single phase extractor 102, 104 is filled even if the thickness of liquid 113, as illustrated in the third part of FIG. 9, is not high enough to reach the bottom of the single phase extractor 102, 104.

Even this arrangement may not be enough to remove the final film 112 from the surface of the substrate W. For this purpose the gas knife 120 and outlets 126, 124 (which are held at an under pressure) are used to remove the final film 112 and/or droplets remaining on the substrate after passing the single phase extractors 102, 104.

The fourth part of FIG. 9 illustrates that the surfaces 142, 143 of the dryer 100 between the inlet 115 and respectively the single phase extractors 102, 104 as well as the leading 141 and trailing 144 edges of the single phase extractors 102, 104 and a part of the leading edge 146 of the whole dryer apparatus 100 and the inner surfaces 148, 149 of the outlet 126 are made to be liquid phobic. This is so that when the drying action is complete and the liquid supply system 110 is turned off so that no more priming liquid exits inlet 115, any remaining liquid (such as liquid 17 in FIG. 7) automatically moves away from the liquidphobic surface toward the single phase extractor 102, 104 where, it still being in contact with the single phase extractor, can be removed or it moves to the outlet 126 where it can be removed. As can be seen, after or as soon as the liquid supply system 110 has been turned off, the gas knife 120 is switched off and the outlets 126 and 124 are no longer held at an under pressure.

A further way of ensuring that any remaining liquid 17 is removed includes applying a gas at an over pressure to inlet 115. The force of gas exiting the inlet 115 on the remaining liquid 17 will be effective to move the liquid under the single phase extractors 102, 104 where it can be removed. Alternatively or additionally, the under pressure applied to outlet 126 could be increased. This can be effective to suck the remaining liquid to under the single phase extractor 104 and/or into outlet 126.

Figure 10:
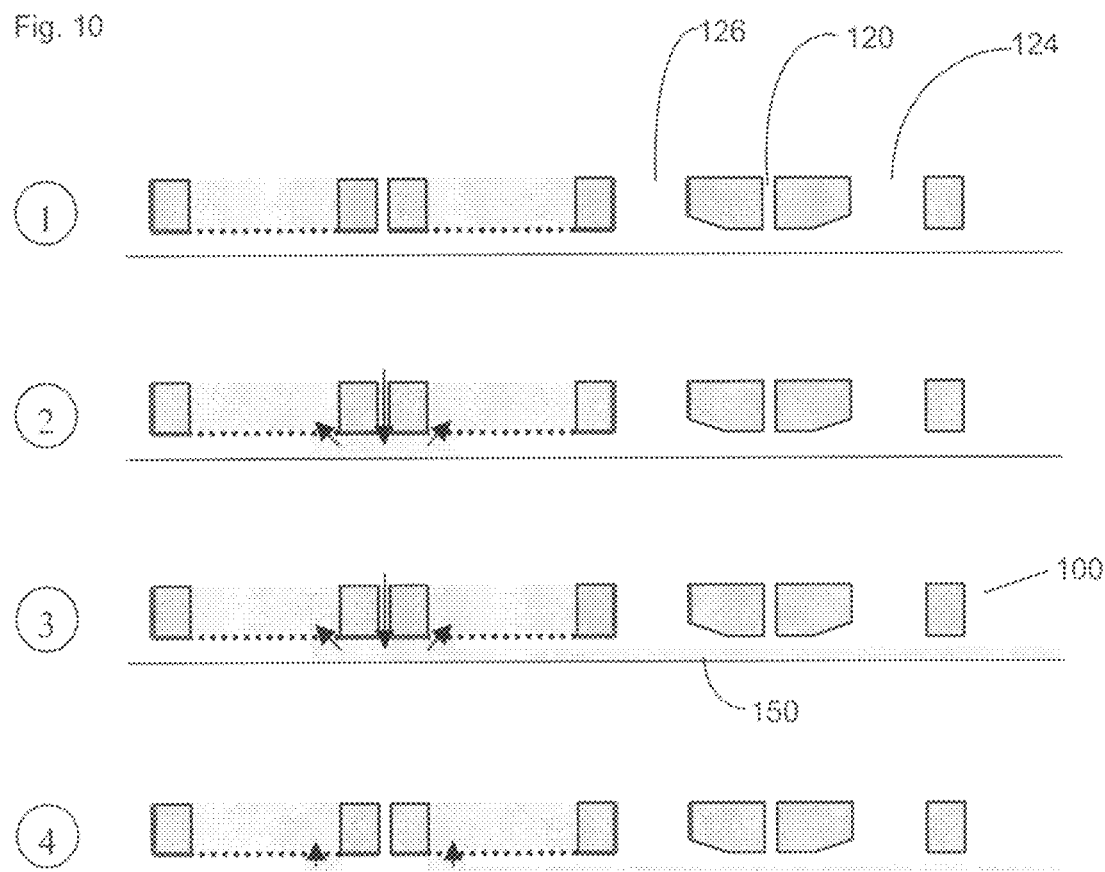
FIG. 10 illustrates how the drying unit of FIG. 9 may be used as a wetting unit.

FIG. 10 illustrates how the same apparatus as illustrated in FIGS. 8 and 9 can be used for pre-wetting of the top surface of the substrate W as might be used in the above mentioned pre-wetting prior to imaging. During this process the gas knife 120 and the outlets 124, 126 are not activated. However, the liquid supply system 110 and the single phase extractors 102, 104 are both activated and the dryer 100 and/or the substrate W are moved relative to one another in plan at such a speed that a film 150 is left behind on the surface of the substrate.

Figure 11:
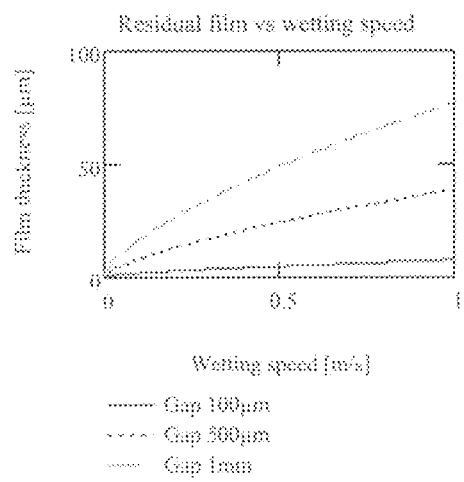
FIG. 11 illustrates the effect of certain variables on wetting performance.

FIG. 11 illustrates how the film 150 thickness may be varied depending on the speed of relative movement of the dryer 100 and the substrate W and on the size of the gap between the dryer 100 and the substrate W. As can be seen, for a larger gap, a larger film thickness can be left behind at a lower speed. For a smaller gap size, a larger relative speed between the dryer 100 and the substrate W leads to a thicker film. These parameters can also be varied by changing the rate of liquid supply through the liquid inlet 115 and by varying the under pressure applied to the single phase extractors 102, 104.

The apparatus comprises a controller configured to control when liquid is provided to the inlet 115, the extraction rate of the single phase extractors 102, 104, the under pressure applied to the outlet 126, the height of the dryer over the surface to be dried, the over pressure applied to the gas knife 120, the under pressure applied to the outlet 124, or any combination of the foregoing. The controller may control all or only some of the above parameters and may do so at different stages of the drying and/or wetting process. For example, at the end of a drying step, the controller may reduce the height of the dryer above the surface being dried to ensure that as much of the remaining liquid 17 as possible is extracted.

Referring to FIGS. 12 and 13, a further embodiment will now be described which is the same as the embodiment described with respect to FIGS. 8-11 except as described below. In this embodiment, the single phase extractors are replaced by a different liquid removal device. The liquid removal device of this embodiment is a meniscus pinning feature. If little droplets of liquid are present on the surface to be dried, then the device does not work particularly well unless priming liquid is provided because the device depends on the surface tension of the liquid, and therefore the presence of liquid, to work.

FIG. 12 illustrates the meniscus pinning device of the liquid remover of the this embodiment which can, for example, replace the single phase extractor described above. The meniscus pinning device of FIG. 12 comprises a plurality of discrete outlets 50. These outlets 50 are illustrated as being circular though this is not necessarily the case. Indeed the outlets may be square, oblong, rectangular, triangular, an elongate slit, etc.

Each or a plurality of the outlets 50 of the meniscus pinning device of FIG. 12 may be connected to a separate under pressure source. Alternatively or additionally, each or a plurality of the outlets 50 is connected to a common chamber (which may be annular) which is itself held at an under pressure. In this way a uniform under pressure at each or a plurality of the outlets can be achieved. A ridge 70 may be provided between adjacent outlets 50. As can be seen from FIG. 13, which is a cross-section through lines XIII-XIII in FIG. 12, the outlet 50 is formed as a protrusion from the bottom surface 40 of the dryer 100, i.e., a bottom surface of outlet 50 is displaced vertically from the surface 40. The ridge 70 is positioned at the same height or protrudes by the same amount or less from the surface of the dryer 100 as the outlet 50. The outlet 50 is an outlet of a tube or elongate passageway 55, for example. Desirably, the outlet is positioned such that it faces the substrate. Another way of thinking of this is that an elongate axis of the passageway 55 to which the outlet 50 is connected is substantially perpendicular (e.g., within ±45°, desirably within 35°, within 25° or within 15° from perpendicular) to the top surface of the substrate W.

Each outlet 50 is designed to extract a mixture of liquid and gas. The liquid is extracted from the space 11 whereas the gas is extracted from the atmosphere on the other side of the outlets 50 and ridges 70 to the liquid. This creates a gas flow as illustrated by arrows 1000 and this gas flow is effective to pin substantially in place the meniscus 90 between the outlets 50 as illustrated in FIG. 12. As can be seen from FIG. 12, the outlets and ridges are positioned so as to form, in plan, a line, but any shape may be used.

FIG. 13 illustrates that the outlet 50 is provided as a protrusion from the bottom surface 40 of the dryer 100. This is however not necessarily the case and the outlets 50 may be in the major bottom surface of the dryer 100. In this case the liquid will abut the major bottom surface and thus not have a free top surface which is prone to undesirable generation of waves. In this case there is no definable ridge 70. Arrow 1000 shows the flow of gas from outside of the dryer 100 into the passageway 55 associated with the outlet 50 and the arrow next to arrow 1000 illustrates the passage of liquid from the space into the outlet 50. The passageway 55 and outlet 50 are designed so that two phase extraction (i.e. gas and liquid) occurs in an annular flow mode in which gas substantially flows through the center of the passageway 55 and liquid substantially flows along the wall(s) of the passageway 55. This may result in smooth flow without the generation of pulsations.

The meniscus is pinned between the outlets 50 due to drag forces induced by gas flow into the outlets 50. A gas drag velocity of greater than about 15 m/s, desirably 20 m/s should be sufficient. By avoiding the need for a gas knife the amount of evaporation of liquid from the substrate is reduced thereby reducing both splashing of liquid as well as thermal expansion/contraction effects.

Discrete needles each with a diameter of 1 mm and separated by 3.9 mm may be effective to pin a meniscus. The total gas flow in such a system is of the order of 100 l/min.

The problem with the above dryer based on the meniscus pinning feature on its own is that if a surface is being dried which has discrete deposits of liquid on it, the meniscus 90 may not be established and the drying action may not be particularly efficient. Thus, as in the earlier embodiment, a liquid supply system 110 may be provided which deposits a priming liquid on the surface. Thus, in use, the surface is moved in direction of arrow 500 relative to the dryer 100 and a priming liquid is supplied by the liquid supply system 110 which extends along the length of the line of outlets 50. Thus, it is always ensured that liquid is present on the left hand side (as illustrated) of the line of outlets 50 so that the meniscus 90 can be established and the drying action efficiency improved.

As will be appreciated, the liquid supply system 110 has its outlet positioned so that any surface being dried first passes underneath the outlet of the liquid supply system 110 before arriving at the outlets 50 of the meniscus pinning device. Thus, as can be seen in FIG. 13, the whole of the space ahead of the dryer under the liquid supply system 110 is filled with liquid and this will be the case along the whole length of the line of outlets 50. Thus, even individual liquid particles such as that illustrated on the left hand side of FIG. 13 are incorporated into that mass of liquid and can thereby be removed from the surface.

In an embodiment, the outlet of the liquid supply system 110 can be positioned on the other side of the line of outlets 50 relative to the direction of movement of the substrate W. Such an outlet is illustrated in dashed lines 1100 in FIGS. 12 and 13. In this embodiment it is in combination with the gas flow 1000 that the priming liquid is effective to help in the extraction of the droplets. A further embodiment is to provide the outlets of the liquid supply system 110 in the line of outlets 50 between the outlets 50.

The principles of operation of the embodiment of FIGS. 12 and 13 are very similar to those of the embodiment described with respect to FIGS. 8-11, as will be appreciated. One difference is that there is no need to supply a liquid remover on either side of the liquid supply system 110 and there likely would be no advantage of doing this. As will also be appreciated, the dryer of the embodiment of FIGS. 12 and 13 may also be used in wetting the surface using similar principles to those of the embodiment described with respect to FIGS. 8-11. In the wetting mode, the effectiveness of the meniscus pinning is reduced by reducing the gas flow into the outlets 50 and/or varying the height of the dryer over the surface.

As can be seen from the above, an embodiment of the present invention can be used with any type of liquid removal device including, but not limited to, the examples described above.

Figure 14:
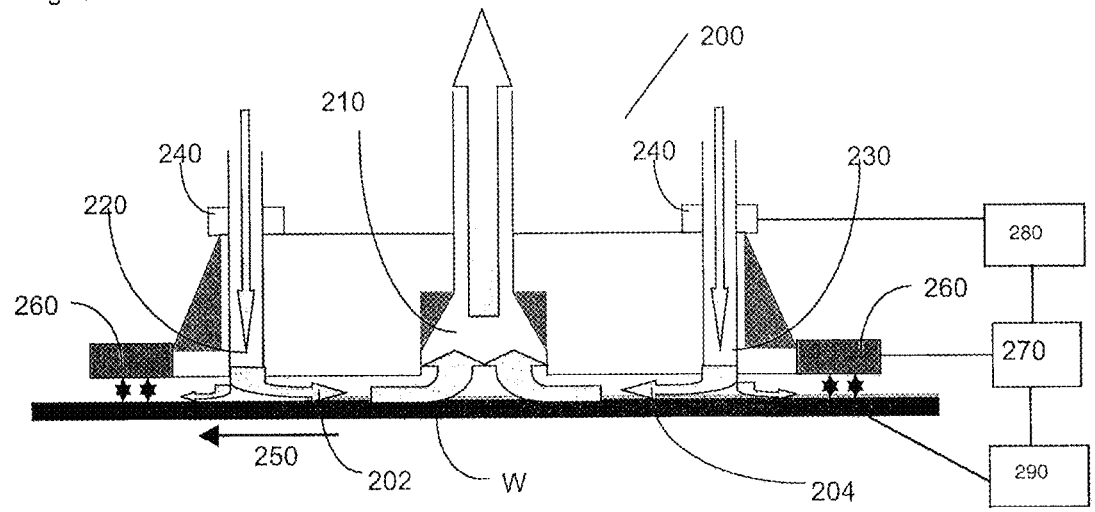
FIG. 14 illustrates, in cross-section, a further embodiment of a dryer.

FIG. 14 illustrates a further embodiment of a dryer 200. This dryer 200 is particularly suited for use with a high refractive index fluid such as an organic fluid. High refractive index fluid generally has better wetting characteristics than water. The dryer 200 of FIG. 14 does not need a primer and instead works on the principle of using a gas flow and an under pressure.

In the embodiment illustrated in FIG. 14 a flow of gas 202, 204 is generated over the surface of the substrate W to be dried. This flow of gas 202, 204 is substantially parallel to the surface to be dried. The flow of gas is generated by providing an outlet 210 which is connected to an under pressure source. On either side of the outlet 210 are gas inlets 220, 230 (although a single inlet 220 or 230 may be used). Each of the inlets 220, 230 is connected to a source of gas. Desirably the gas is dried gas. The gas may also be heated by a heater 240 prior to exiting the inlet 220, 230. In an embodiment, the gas is inert to the liquid which is being dried from the surface (i.e. the immersion liquid). In the case of a high refractive index immersion liquid, such as an organic liquid, the gas should be free of oxygen. Oxygen can react with the organic fluid and degrade its optical properties. In such an instance of degradation it would not be possible to recycle the immersion liquid. This increases costs. If a gas, such as $N_2$, is used which does react with the immersion liquid, the fluid recovery system can remove that gas from the liquid before reuse of the liquid.

As can be seen, the substrate W is moved in direction 250 underneath the dryer. Therefore, as can be seen, the last interaction of gas with the substrate W is fresh gas from the inlet 220. That is, the last gas to touch the surface of the substrate is dried gas which has not been in contact with the fluid being dried. Thus, this gas has a further drying effect. The temperature of the gas can be controlled by use of one or more heaters 240. If necessary, one or more coolers could also be used. This temperature control may be particularly required for some low volatility fluids.

Also illustrated in FIG. 14 are one or more height sensors 260. The height sensor(s) and the associated controller 270 (described below) can be used on any type of dryer. The height sensor 260 detects the height between the dryer 200 and the surface to be dried. This detected information is fed to a controller 270 which can adjust the height between the dryer 200 and the surface being dried. This is achieved, for example, by using an actuator 280 to adjust the position of the dryer 200 and/or using an actuator 290 to control the substrate table WT on which the substrate is being carried. In this way the distance between the dryer and the surface being dried can be optimized. For example, this is done by maintaining the distance between two values which values may be pre-determined.

As with the other embodiments, the inlets 220, 230 and outlet 210 are elongate (in and out of the page as illustrated). The flow of gas out of the inlets 220, 230 is balanced so that approximately 80% of the gas is drawn into the outlet 210 by the under pressure. The gas and liquid and liquid vapor is exhausted away through the outlet 210. In an apparatus, as with the other embodiments, the dryer 200 may be stationary relative to the rest of the apparatus and the substrate W moved underneath it. The opposite can also be true.

Figure 15:
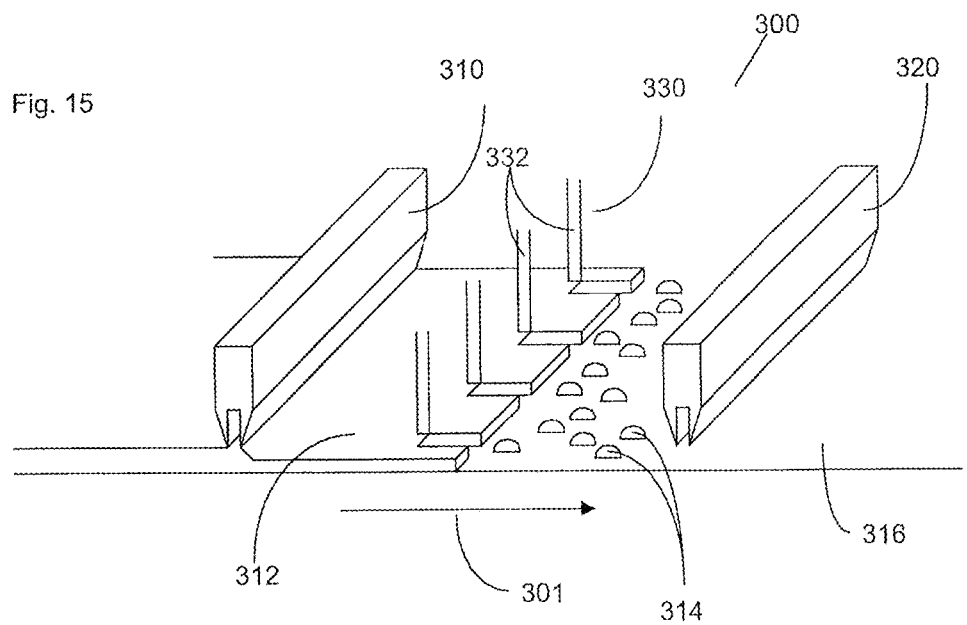
FIG. 15 illustrates, in cross-section, a further embodiment of a dryer.

FIG. 15 illustrates a further embodiment of a dryer 300. In FIG. 15, two gas knives 310, 320 are provided. The gas knives are spaced apart. Each gas knife 310, 320 is comprised of an outlet for the extraction of gas and/or liquid there through and an inlet for the provision of gas. After the surface to be dried has passed under the first gas knife 310, a thin film of liquid 312 may still be left on the surface to be dried. With time this thin film 312 will break up into droplets which can easily be removed by a second gas knife 320 which is similar in design to the first gas knife 310. However, to increase the speed of break up, a disrupter 330 is provided between the two gas knives 310, 320. Thus, a surface moving in direction 301 under the dryer 300 will first pass under the first gas knife 310. Then the surface passes under the disrupter 330 where the thin film of liquid 312 left behind after the first gas knife 310 is broken up into droplets 314. Then the surface passes under the gas knife 320 where the droplets 314 can be removed leaving a dry surface 316.

The disrupter 330 may take any form. As illustrated, the disrupter 330 includes one or more gas jets 332, each of which applies a jet of gas to a localized area. In plan, the jet of gas is directed to an area with a low aspect ratio. That is, the area is almost a point and desirably circular. The aspect ratio of the area is, in an embodiment, between 1:0.5 and 1:2. This disrupts the film 312 as illustrated in FIG. 15 and leads to rapid break up into droplets 314 after the surface has passed under the disrupter 330. This is because the surface tension and cohesion of the fluid provides energy for the break up into droplets 314 as soon as the film has been disrupted. In one embodiment, the gas provided by the disrupter 330 contains a surfactant. The surfactant changes the surface energy of the liquid and results in faster break up.

In all embodiments, the drying efficiency varies with the angle which the dryer makes to the surface to be dried. The drying speed increases with 1/cos(angle).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
a substrate table configured to hold a substrate;
a projection system configured to project a patterned beam of radiation onto the substrate;
a liquid supply system including a liquid confinement structure configured to at least partly confine a liquid to a space between the projection system and the substrate table and to define an open aperture surrounding a path of the radiation through the liquid, and comprises a first inlet having a first supply orifice to supply a liquid to the space and the aperture; and
a liquid removal system comprising:
a second supply orifice of a second liquid supply inlet, from which a further liquid is to come out, the second supply orifice being horizontally outward, relative to an optical axis of the projection system, of the first supply orifice; and
a removal orifice of a liquid remover on either side or both sides of the second supply orifice, the removal orifice configured to remove existing liquid on top of an object and located horizontally outward, relative to the optical axis of the projection system, of the first supply orifice,
wherein the second liquid supply inlet is configured to deliver the further liquid to the liquid remover to allow the liquid remover to remove the existing liquid.

2. The apparatus of claim 1, wherein the second supply orifice is positioned adjacent the removal orifice of the liquid remover.

3. The apparatus of claim 1, wherein the second supply orifice is positioned such that, in use, the further liquid from the second supply orifice bridges a gap between the object and the removal orifice of the liquid remover.

4. The apparatus of claim 1, further comprising a controller configured to control the liquid removal system, the controller being arranged to control the second liquid supply inlet to prime the liquid remover prior to use of the liquid removal system and to control the second liquid supply inlet to continue providing the further liquid during use of the liquid removal system.

5. The apparatus of claim 4, wherein the controller is configured to control a height of the liquid removal system over the top of the object, an extraction pressure of the liquid remover, or both.

6. The apparatus of claim 1, wherein a surface between the second supply orifice and the removal orifice of the liquid remover is liquid phobic.

7. The apparatus of claim 1, wherein a leading and/or trailing edge of the liquid remover and/or a surface of the liquid removal system next to the leading or trailing edge, is liquid phobic.

8. The apparatus of claim 1, wherein the liquid remover is configured to pin substantially in place a meniscus of liquid on the object relative to the liquid remover and the second liquid supply inlet is configured to deliver the further liquid on the object.

9. The apparatus of claim 8, wherein the liquid remover is configured to pin the meniscus by means of a gas flow.

10. The apparatus of claim 8, wherein the liquid remover comprises a plurality of discrete outlets each configured to be connected to an under pressure source.

11. The apparatus of claim 1, wherein the object comprises a substrate, a substrate table, a sensor, or any combination of the foregoing.

12. The apparatus of claim 1, wherein the liquid removal system comprises a plurality of outlets arranged in a line and each connected to an under pressure source; and the second liquid supply inlet is configured to provide the further liquid to the object.

13. The apparatus of claim 1, further comprising:
an outlet connected to an under pressure source; and
an inlet configured to create a flow of gas over, and substantially parallel to, the surface.

14. The apparatus of claim 1, further comprising:
a sensor configured to detect a distance between the liquid remover and a surface being dried; and
an actuator configured to control the distance between the liquid remover and the surface being dried based on a signal representative of the distance received from the sensor.

15. The lithographic projection apparatus of claim 1, wherein the liquid and the further liquid are of substantially the same material.

16. The lithographic projection apparatus of claim 1, wherein the second supply orifice and the removal orifice are spaced apart by a gap from the liquid confinement structure.

17. The lithographic projection apparatus of claim 1, wherein the second supply orifice is surrounded by the removal orifice.

18. The lithographic projection apparatus of claim 1, wherein the removal orifice is elongate.

19. The lithographic projection apparatus of claim 18, wherein the second supply orifice is elongate.

20. The lithographic projection apparatus of claim 1, wherein the removal orifice comprises a first elongate opening and a second elongate opening, each on either side of the second supply orifice.

21. The lithographic projection apparatus of claim 1, further comprising a gas outlet spaced apart by a gap from the liquid confinement structure, the gas outlet configured to supply a gas to the substrate and/or the substrate table.

22. The apparatus of claim 1, wherein, regardless at which side of the second supply orifice the removal orifice is located, the removal orifice is located horizontally outward, relative to the optical axis of the projection system, of the first supply orifice.

23. A lithographic projection apparatus comprising:
a substrate table configured to support a substrate;
a liquid confinement structure body configured to at least partly confine a liquid to a space between a projection system and the substrate table, wherein the liquid confinement structure comprises a first inlet to supply the liquid; and
a liquid removal structure body spaced apart by a gas gap from the liquid confinement structure body, the liquid removal structure body comprising:
an outlet connected to a suction source to allow extraction of the liquid on top of the substrate, the substrate table, or both, and
a liquid supply system comprising a second inlet configured to supply a further liquid in a space between the outlet and the substrate and/or the substrate table such that there is liquid contact between the outlet and the liquid on top of the substrate and/or the substrate table.

24. The lithographic projection apparatus of claim 23, further comprising a gas outlet spaced apart by a gap from the liquid confinement structure body, the gas outlet configured to provide gas to the substrate and/or substrate table.

25. The lithographic projection apparatus of claim 23, wherein an inlet of the liquid supply system is surrounded by the outlet.

26. The lithographic projection apparatus of claim 23, wherein the outlet comprises an opening at a first side of an inlet of the liquid supply system and at a second opposite side of the inlet.

27. A device manufacturing method comprising:
supplying a liquid outward through a first orifice onto a substrate;
projecting a patterned beam of radiation, along a path through the liquid, onto the substrate;
positioning a surface under a downwardly-facing extraction opening of a liquid remover, the surface comprising an existing liquid on top of and in contact with the surface, the existing liquid including at least part of the liquid;
delivering a further liquid, separately provided from the existing liquid and provided out through a second orifice that is different from the first orifice and that is located outward, relative to the path, of the first orifice, to the liquid remover to provide liquid contact between the existing liquid on top of and in contact with the surface and the extraction opening of the liquid remover, the existing liquid on top of and in contact with the surface and the existing liquid having a top surface lower than the extraction opening prior to contact with the further liquid; and
activating the liquid remover to start removing at least the existing liquid by suction.

28. A device manufacturing method comprising:
supplying a liquid onto a substrate via a first supply orifice of a first liquid supply inlet;
projecting a patterned beam of radiation, along a path through the liquid, onto the substrate;
at least partly confining the liquid to a space on the substrate using a liquid confinement structure, the liquid confinement structure defining an open aperture surrounding the path of the radiation and comprising the first liquid supply orifice; and
removing an existing liquid including at least part of the liquid on top of and in contact with a surface, the liquid removing comprising:
positioning the surface under a liquid removal system, the liquid removal system comprising a second supply orifice of a second liquid supply inlet, from which a further liquid is to come out, the second supply orifice being horizontally outward, relative to an optical axis of the projection system, of the first supply orifice, and comprising a removal orifice of a liquid remover on either side or both sides of the second supply orifice, the removal orifice being horizontally outward, relative to the optical axis of the projection system, of the first supply orifice,
delivering, via the second supply orifice, the further liquid, separately provided from the liquid, to the liquid remover to provide liquid contact between the existing liquid on top of the surface and the removal orifice of the liquid remover, and
activating the liquid remover to start removing at least the existing liquid by suction.

29. The method of claim 28, wherein the second supply orifice and the removal orifice are spaced apart by a gap from the liquid confinement structure having the first supply orifice.

30. The method of claim 28, wherein the second supply orifice is surrounded by the removal orifice.

31. A lithographic projection apparatus comprising:
a substrate table configured to support a substrate;
a liquid confinement structure configured to at least partly confine a liquid to a space between a projection system and the substrate table and to define an open aperture surrounding a path of a radiation through the liquid, the liquid confinement structure comprising a first supply orifice to supply the liquid to the space and the aperture, and an opening configured to remove at least part of the liquid from the space, the opening being in a downward facing surface of the liquid confinement structure; and
a liquid removal structure comprising:
a second supply orifice from which a further liquid is to come out onto the substrate and/or onto the substrate table, the second supply orifice being horizontally outward, relative to an optical axis of the projection system, of the first supply orifice and the opening; and
a removal orifice on either side or both sides of the second supply orifice, the removal orifice configured to remove at least part of the further liquid from the substrate and/or from the substrate table and the removal orifice is located horizontally outward, relative to the optical axis of the projection system, of the first supply orifice and the opening.

32. The lithographic projection apparatus of claim 31, wherein the second supply orifice and the removal orifice are spaced apart by a gap from the liquid confinement structure.

33. The lithographic projection apparatus of claim 31, wherein the second supply orifice is surrounded by the removal orifice.

34. The lithographic projection apparatus of claim 31, wherein the removal orifice is elongate.

35. The lithographic projection apparatus of claim 34, wherein the second supply orifice is elongate.

36. The lithographic projection apparatus of claim 31, further comprising a gas outlet spaced apart by a gap from the liquid confinement structure, the gas outlet configured to supply a gas to the substrate and/or the substrate table.

37. The lithographic projection apparatus of claim 31, wherein the liquid and the further liquid are of substantially the same material.

\* \* \* \* \*